United States Patent
Hall et al.

(10) Patent No.: US 12,066,504 B2
(45) Date of Patent: Aug. 20, 2024

(54) METHOD FOR DETERMINING AN INDICATION OF WHETHER THREE PHASE CABLES ARE CORRECTLY OR ERRONEOUSLY CONNECTED BETWEEN POWER ELECTRONICS AND AN ELECTRICAL MACHINE COMPRISED IN AN AT LEAST PARTLY ELECTRICALLY OPERATED VEHICLE OR VESSEL

(71) Applicant: VOLVO TRUCK CORPORATION, Gothenburg (SE)

(72) Inventors: Sebastian Hall, Hisings Backa (SE); Andreas Gillström, Västra Frölunda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 17/662,269

(22) Filed: May 6, 2022

(65) Prior Publication Data
US 2022/0357413 A1     Nov. 10, 2022

(30) Foreign Application Priority Data
May 6, 2021   (EP) .................................. 21172414

(51) Int. Cl.
*G01R 31/67* (2020.01)
(52) U.S. Cl.
CPC .................... *G01R 31/67* (2020.01)
(58) Field of Classification Search
CPC ............... G01R 31/67; B60L 3/0061
See application file for complete search history.

(56) References Cited

U.S. PATENT DOCUMENTS

| | | | |
|---|---|---|---|
| 9,087,418 B2* | 7/2015 | Luedtke | B60L 15/2009 |
| 2013/0214711 A1* | 8/2013 | Omata | H02P 21/22 |
| | | | 318/400.02 |
| 2014/0253091 A1 | 9/2014 | Ishihara et al. | |
| 2020/0017039 A1 | 1/2020 | Li et al. | |
| 2021/0070185 A1* | 3/2021 | Liu | B60L 53/51 |

FOREIGN PATENT DOCUMENTS

| | | | |
|---|---|---|---|
| CN | 102215023 A | * 10/2011 | H02P 21/14 |
| CN | 104316822 A | 1/2015 | |
| EP | 4134683 A1 | * 2/2023 | |

OTHER PUBLICATIONS

Extended European Search Report in corresponding European Application No. 21172414.1 dated Nov. 3, 2021 (24 pages).

* cited by examiner

*Primary Examiner* — Thang X Le
*Assistant Examiner* — Haidong Zhang
(74) *Attorney, Agent, or Firm* — Venable LLP; Jeffri A. Kaminski

(57) ABSTRACT

A method performed by a control unit for determining an indication of whether three phase cables are correctly or erroneously connected between power electronics and an electrical machine comprised in an at least partly electrically operated vehicle or vessel. The control unit triggers generation of a current vector in the electrical machine from a voltage vector. The voltage vector has a voltage angle. When the current vector has a reached a current amplitude reference, the control unit obtains a current angle of the current vector and signs of derivatives of the voltage angle and the current angle. Based on the signs of derivatives, the control unit determines an indication of whether or not the phase cables are correctly or erroneously connected.

9 Claims, 9 Drawing Sheets

METHOD FOR DETERMINING AN INDICATION OF WHETHER THREE PHASE CABLES ARE CORRECTLY OR ERRONEOUSLY CONNECTED BETWEEN POWER ELECTRONICS AND AN ELECTRICAL MACHINE COMPRISED IN AN AT LEAST PARTLY ELECTRICALLY OPERATED VEHICLE OR VESSEL

TECHNICAL FIELD

The invention relates to a method, a control unit, an at least partly electrically operated vehicle or vessel The invention can be applied in at least partly electrical heavy-duty vehicles, such as trucks, buses and construction equipment etc. Although the invention will be described with respect to a fully electrified truck, the invention is not restricted to this particular vehicle, but may also be used in other vehicles such as buses, trailers, wheel loaders, articulated haulers, excavators, backhoe loaders, passenger cars, marine vessels, construction equipment etc. It may also be applied in electrical systems of e.g., electrically operated vessels and in various industrial construction machines or working machines. It is applicable in fully electrically operated vehicles as well as in hybrid vehicles, comprising also a combustion engine. The term vehicle will be used herein for the sake of simplicity when referring any of the above exemplified vehicles.

BACKGROUND

An at least partly electrically operated vehicle or vessel comprises power electronics which is connected to an electric machine with three phase cables. The power electronics may be referred to as or comprise a three-phase converter. In order for the power electronics to control the electric machine, it is important that the phase cables are correctly connected between them.

At occasions, the three phase cables of an electrical machine are mounted wrongly to the power electronics. FIG. 1a shows a correct connection of phase cables 101 between power electronics 103 and the electrical machine 105, while FIG. 1b and FIG. 1c show erroneous installations. If the electrical machine 105 is controlled by a field-oriented closed-loop current control algorithm, an erroneous installation may result two fault cases:

When two of the phase cables 101 are switched, see FIG. 1b, the rotational direction of the current vector opposes the direction of the voltage vector, the phase sequence is inversed. Consequently, the electrical machine 105 starts to shake after a torque request to the electrical machine 105.

When the phase cables 101 are shifted, see FIG. 1c, the position of the vectors in the stationary and synchronous reference frame, and consequently the phase sequence, are shifted and the current control gives currents that are significantly different than expected. In the worst case, the resulting torque can be in the opposite direction than the requested.

FIGS. 1a, 1b, 1c will be described in more detail later.

To avoid the fault cases, it is necessary to verify if the phase cables 101 are connected correctly to the power electronics 103 before start-up. Today, the verification is done manually using a trial-and-error method. If for example the electrical machine 105 behaves incorrectly, a manual fault search is performed, and the erroneous phase-cable connection is hopefully traced. This manual method is time consuming, costly and the error may not even be detected by the manual inspection. The service personnel may even not know that the error or undesired behavior of the vehicle is a result of erroneously connected phase cables. The service personnel may not even think of verifying the connection of the phase cables 101 when trying to locate and correct the error or undesirable behaviors of the vehicle but will instead check other parts of the vehicle that are known to be a source of similar undesirable vehicle behavior.

Therefore, there is a need to at least mitigate or solve this issue.

SUMMARY

An object of the invention is to improve determining of an indication of whether three phase cables are connected correctly or erroneously between power electronics and an electrical machine comprised an at least partly electrically operated vehicle or vessel.

According to a first aspect of the invention, the object is achieved by a method performed by a control unit for determining an indication of whether three phase cables are correctly or erroneously connected between power electronics and an electrical machine comprised in an at least partly electrically operated vehicle or vessel according to claim 1. The control unit triggers generation of a current vector in the electrical machine from a voltage vector. The current vector and the voltage vector are both rotating vectors that rotate with the same angular frequency. The voltage vector has a voltage angle. When the current vector has a reached a current amplitude reference, the control unit obtains a current angle of the current vector and signs of derivatives of the voltage angle and the current angle. Based on the signs of derivatives, the control unit determines an indication of whether or not the phase cables are correctly or erroneously connected. By the provision of a method which comprises, the advantage of improving the determining of an indication of whether or not three phase cables are connected correctly between power electronics and the electrical machine comprised an at least partly electrically operated vehicle or vessel is provided.

Optionally, the control unit may determine an indication of whether or not the phase cables are correctly or erroneously connected by comparing the signs of derivatives of the voltage angle and the current angle. Hereby an advantage of enabling the determining of an indication of whether or not three phase cables are connected correctly between power electronics and the electrical machine comprised an at least partly electrically operated vehicle or vessel is provided.

Optionally, the control unit may determine an indication of whether or not the phase cables are correctly or erroneously connected comprises by determining an indication of that the phase cables are erroneously connected if the signs of derivatives differ. The signs of the derivatives are parameters that is easily available and that provides a clear and correct indication of whether or not three phase cables are connected correctly between power electronics and the electrical machine comprised an at least partly electrically operated vehicle or vessel.

Optionally, the control unit may determine an indication of whether or not the phase cables are correctly or erroneously connected further based on the current angle and the voltage angle. By using the current angle and the voltage angle an improvement is provided in that the decision is taken based on a plurality of parameters which increases the reliability of the decision. By basing the decision further on the current angle and the voltage angle, it may be possible to rule out all erroneous connections. If an error is not found when comparing the derivatives, it may be necessary to use the current angle and the voltage angle to rule out all possible erroneous connections.

Optionally, the control unit may determine an indication of whether or not the phase cables are correctly or erroneously connected by determining, for a first time, a difference between the voltage angle and the current angle if the signs of derivatives are the same, determining that there is an indication of that the phase cables are correctly connected if the difference is approximately 90 degrees, and determining that there is an indication of that the phase cables are erroneously connected if is not approximately 90 degrees. Hereby an advantage of enabling the determining that there is an indication of whether or not three phase cables are connected correctly between power electronics and the electrical machine comprised an at least partly electrically operated vehicle or vessel is provided.

Optionally, when an indication of that the phase cables are erroneously connected has been determined, the control unit may determine in which way the phase cables have been erroneously connected. Hereby an improvement in that more information about the erroneously connected cables is provided and it is made easier for the service personnel to correct the error since they know in which way the cables have been erroneously connected.

Optionally, the control unit may determine in which way the phase cables have been erroneously connected by determining, for a first time or a second time, a difference between the voltage angle and the current angle. The phase cables may be erroneously connected in a first way if the difference is approximately 90 degrees. The phase cables may be erroneously connected in a second way if the difference is not approximately 90 degrees. Hereby an improvement in that more information about the erroneously connected cables is provided and it is made easier for the service personnel to correct the error since they know in which way the cables have been erroneously connected.

Optionally, two phase cables may be swapped when the signs of derivatives of the voltage angle and the current angle differ. An advantage of this may be that, with such information, it is easy to correct the erroneously connected cables and possibly also to enable analysis of an action made by the vehicle or vessel due to the swapped cables.

Optionally, the control unit may determine, by means of a closed-loop control, a voltage amplitude of the voltage vector using the current amplitude reference as a reference value. Since the voltage amplitude is determined by means of a closed loop control, the control unit may have full control of the voltage vector and its voltage amplitude. This provides stability to the parameters used in the determining of an indication of whether or not the phase cables are correctly or erroneously connected.

Optionally, if the difference between the voltage angle and the current angle oscillates over one pole pitch, the control unit may trigger removal of the oscillation. The oscillation may occur since the amplitude of the alpha and beta vectors are different depending on the position of the rotor. When the oscillations are removed, it may provide an advantage of enabling analysis of an average angle difference between the current vector and the voltage vector.

According to a second aspect of the invention, the control unit is adapted to perform the method described above. Advantages and effects of the second aspect of the invention are similar to the advantages and effects with respect to the first aspect of the invention. It shall also be noted that all embodiments of the first aspect of the invention are applicable to and combinable with all embodiments of the second aspect of the invention and vice versa.

According to a third aspect of the invention, the at least partly electrically operated vehicle or vessel comprises the control unit described above. Advantages and effects of the third aspect of the invention are similar to the advantages and effects with respect to the first aspect of the invention. It shall also be noted that all embodiments of the first aspect of the invention are applicable to and combinable with all embodiments of the third aspect of the invention and vice versa.

According to a fourth aspect of the invention, the computer program comprises instructions which, when executed on at least one processor, cause the at least one processor to carry out the method according to the first aspect.

According to a fifth aspect of the invention, carrier comprises the computer program of the fourth aspect, wherein the carrier is one of an electronic signal, optical signal, radio signal or computer readable storage medium.

The present invention is not limited to the features and advantages mentioned above. A person skilled in the art will recognize additional features and advantages upon reading the following detailed description.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the Drawings.

The drawings are not necessarily to scale, and the dimensions of certain features may have been exaggerated for the sake of clarity. Emphasis is instead placed upon illustrating the principle.

DETAILED DESCRIPTION OF EXAMPLE EMBODIMENTS OF THE INVENTION

Figure 2:
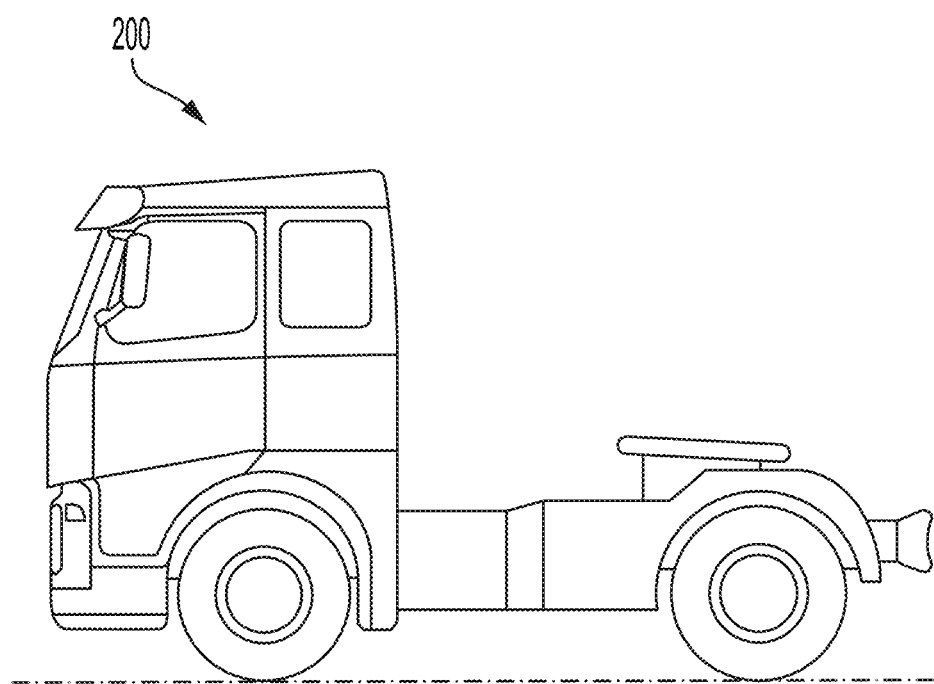
FIG. 2 is a schematic drawing illustrating an at least partly electrically operated vehicle or vessel.

FIG. 2 illustrates an at least partly electrically operated vehicle or vessel 200. The term vehicle may be used herein when referring to the at least partly electrically operated vehicle or vessel 200 for the sake of simplicity. The vehicle 200 may be fully electrical driven or it may be partly electrical driven.

The vehicle 200 may be a heavy-duty vehicle, such as a truck, bus, construction equipment, trailer, wheel loader, excavator, passenger car, a marine vessel, an electrically operated vessel, a working machine, stationary backup power solution etc., or any other type of vehicle mentioned herein.

Figure 3:
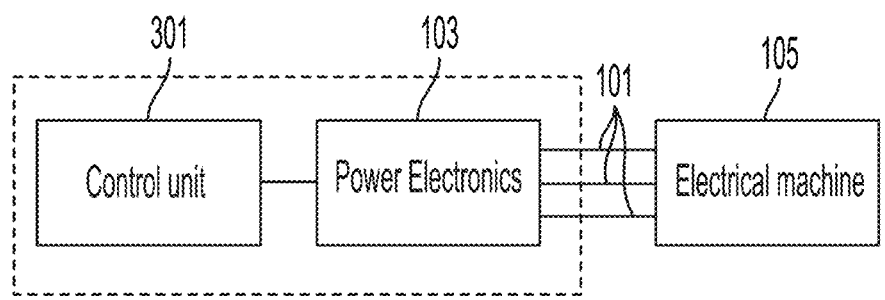
FIG. 3 is a schematic block drawing illustrating a control unit, power electronics, phase cables and an electrical machine.

FIG. 3 is a schematic block diagram illustrating the power electronics 103 adapted to be connected to the electrical machine 105 via three phase cables 101 in the vehicle 200.

The power electronics 103 may be or may comprise a three-phase converter.

The electrical machine 105 is the unit comprised the vehicle 200 that transforms electrical power into mechanical torque on the wheels. The electrical machine 105 may be used as a traction motor and/or as a generator. The electrical machine 105 may be a synchronous electrical machine. The vehicle 200 may comprise one or more electrical machine(s) 105, but only one is illustrated in FIG. 3 for the sake of simplicity. The present invention is applicable to a vehicle 200 comprising any suitable number of electrical machines 105.

The three phase cables 101 may be referred to as high voltage cables.

The vehicle 200 comprises a control unit 301 which may be adapted to be connected to the power electronics 103, or the control unit 301 may be adapted to be co-located with or comprised in the power electronics 103 (as illustrated with the dotted box). The control unit 301 may be connected to the power electronics 103 using any suitable connection means, e.g., a wired connection or a wireless connection. The control unit 301 is adapted to control and monitor one or more units comprised in the vehicle 200, e.g., the power electronics 103, the three phase cables 101, the electrical machine 105 etc. The control unit 301 may be in the form of any suitable computer processor. The control unit 301 may or may not have a user interface on which a user or an operator may monitor and interact with the verification of corrected or erroneously connected phase cables 101.

The control unit 301 is adapted to determine an indication of whether three phase cables 101 are correctly or erroneously connected between power electronics 103 and an electrical machine 105 comprised in the vehicle 200. With the indication, it may be possible to confirm or rule out some cases of erroneous connections. Using FIGS. 1a, 1b and 1c to illustrate the connections of the phase cables 101. The phase cable 101 in FIGS. 1a, 1b and 1c with black filling may be referred to as cable A, the phase cable 101 with solid lines may be referred to as cable B and the phase cable with dotted lines may be referred to as cable C. The order of how the phase cables 101 are connected at the electrical machine 105 is compared with the order of how the phase cables 101 are connected at the power electronics 103. If the order is the same, then the phase cables 101 may be correctly connected. If the order is not the same, then the phase cables 101 may be erroneously connected. As mentioned earlier, erroneously connections may lead to that the electrical machine 105 starts to shake, that the vehicle 202 moves in the opposite direction of what is expected, e.g., it moves backwards instead of forwards etc.

Figure 1A:
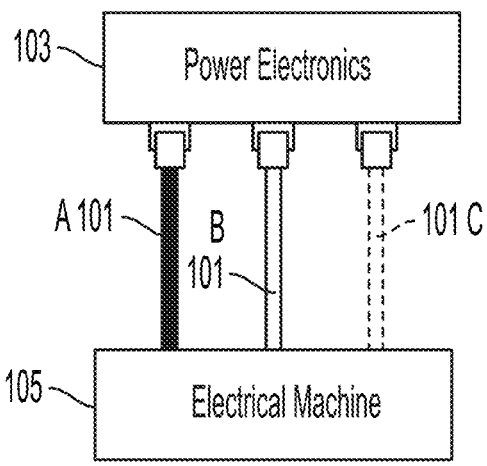
FIGS. 1a, 1b and 1c are schematic drawings illustrating power electronics connected to the electrical machine.

When the three phase cables 101 are correctly connected, then they may be connected as illustrated in FIG. 1a. In FIG. 1a, at the power electronics side, the phase cables 101 are connected in the following order, starting from the left: ABC. At the electrical machine side, the phase cables 101 are connected in the following order, starting from the left: ABC. Thus, in FIG. 1a, the order of the phase cables 101 are the same at both the power electronics side and the electrical machine side, i.e., ABC.

Figure 1B:
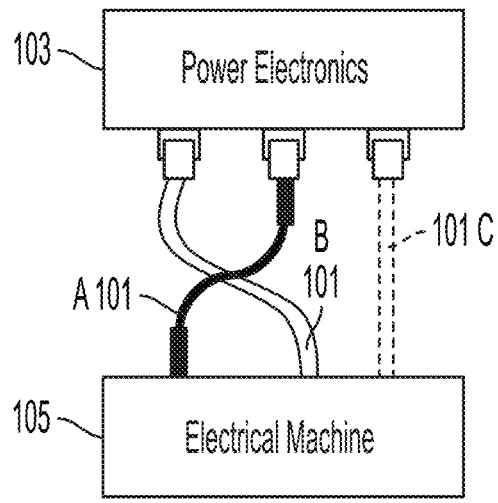
Figure 1C:
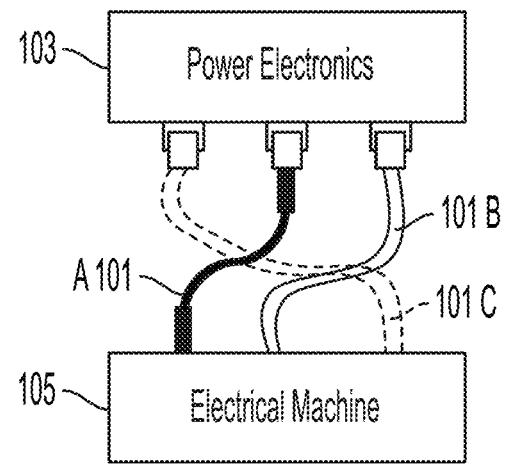

When the three phase cables 101 are erroneously connected, then they may be connected as in FIG. 1b or in FIG. 1c. In FIG. 1b, at the power electronics side, the phase cables 101 are connected in the following order, starting from the left: BAC. At the electrical machine side, the phase cables 101 are connected in the following order, starting from the left: ABC. Thus, in FIG. 1b, the order of the phase cables 101 are not the same at the power electronics side and the electrical machine side, i.e., BAC and ABC. The phase cables 101A and B are switched when comparing the order of the phase cables 101 at the power electronics 103 and the electrical machine 105, and phase cable 101C is connected at the same position in both sides. In other words, in FIG. 1b, two of the phase cables 101 are erroneously connected by being switched or inversed. One of the phase cables 101 are correctly connected.

In FIG. 1c, at the power electronics side, the phase cables 101 are connected in the following order: CAB. At the electrical machine side, the phase cables 101 are connected in the following order: ABC. Thus, in FIG. 1c, the order of the phase cables 101 are not the same at the power electronics side and the electrical machine side, i.e., CAB and ABC. In other words, in FIG. 1c, the order of all the three phase cables 101 are shifted when comparing their position at the power electronics 103 and at the electrical machine 105.

Figure 4:
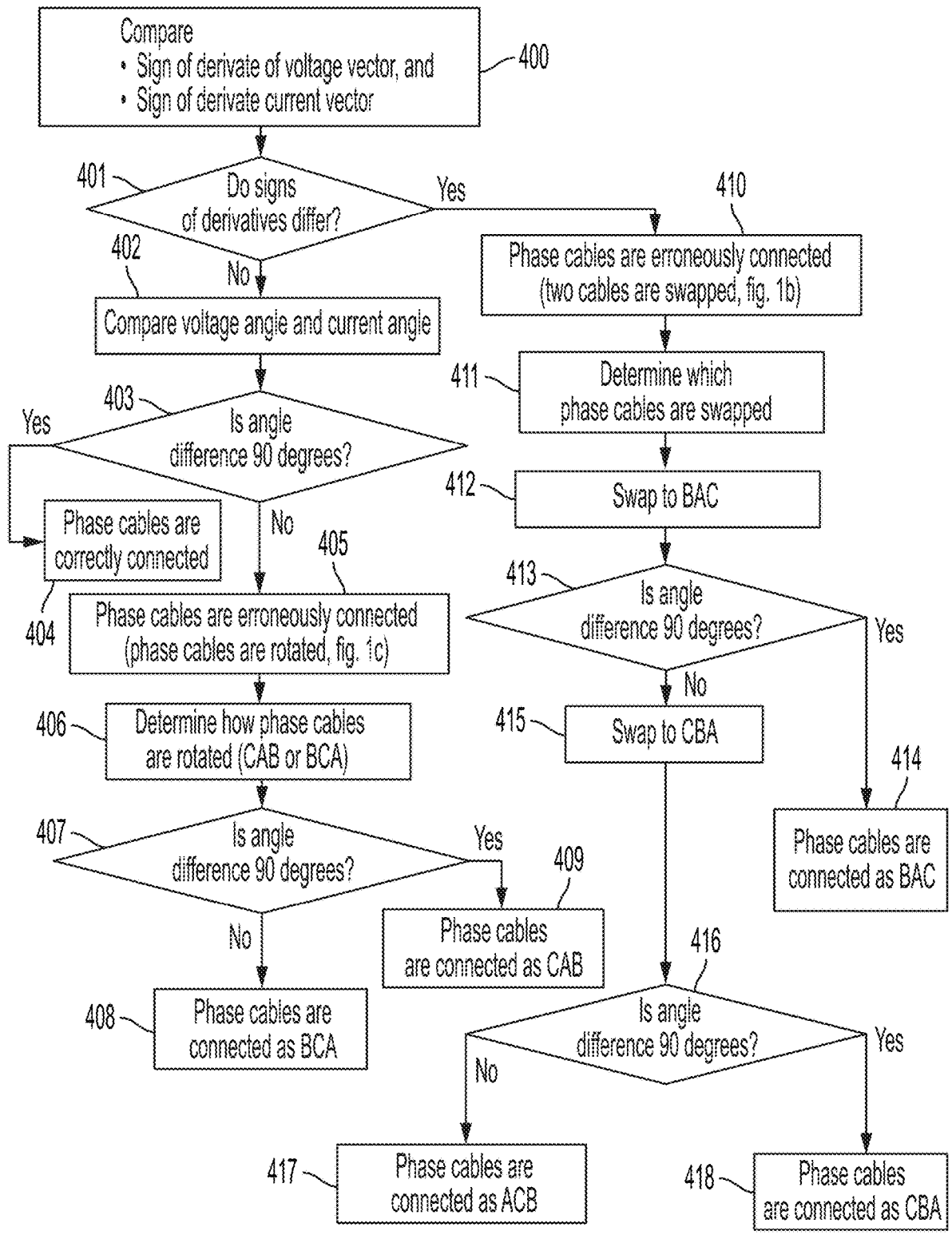
FIG. 4 is a flow chart illustrating a method.

FIG. 4 is a flow chart illustrating a method for determining an indication of whether three phase cables 101 are correctly or erroneously connected between power electronics 103 and an electrical machine 105 comprised in the vehicle 200.

Before the method starts, a rotating current vector in the electrical machine 105 is generated from a pulse-width modulation generated voltage vector. In other words, test signals are generated. The frequency of the voltage vector, and therefore also of the current vector, may be predetermined. Further, a predetermined amplitude of the current may act as a reference value for a closed-loop control of the voltage vector. The current amplitude reference of the current may be important for the stability of the method. The current amplitude reference may be predetermined. A high amplitude generates torque, but a low amplitude worsens the signal-to-noise ratio. So, the current amplitude may be a compromise between the two. A predefined amplitude of the voltage is not considered for the closed loop control of the voltage vector. Consequently, the amplitude of the voltage vector may be decided by the amplitude of the current vector. The dynamics of the controller are slow to ensure a slow increase of the amplitude of the current. The controller is the closed-loop controller that controls the amplitude of the current vector. The slow increase of the current vector minimizes the torque fluctuations of the machine.

Herein, term current vector may be used when referring to a rotating current vector, i.e., a current vector that is rotating or adapted to be rotating. Similarly, the term voltage vector may be used when referring to the rotating voltage vector, i.e., a voltage vector that is rotating or adapted to be rotating.

The voltage vector has a voltage angle, a voltage amplitude and it is a rotating voltage vector. The current vector has a current vector, a current amplitude and it is a rotating current vector. The voltage vector has a defined angular frequency and a variable voltage amplitude to control the current amplitude. The current vector rotates with the same angular frequency as the voltage vector.

Step 400

The control unit 301 measures the signs of the derivatives of the angles of voltage vector and the current vector and compares the measured signs. The signs may be either + or −.

Step 401

The control unit 301 checks if the signs of the derivatives of the angles of voltage vector and the current vector differ of if they are the same. If the signs differ, then the method proceeds to step 410, as indicated with yes in FIG. 4. If the signs do not differ, i.e., they are the same, then the method proceeds to step 402, as indicated with no in FIG. 4.

Step 402

This step is performed if the signs of the derivates of the angles of the voltage vector and the current vector are the same. The signs of both derivates may be either + or −. If the signs of the derivative of the angles of the voltage vector and the current vector are the same, the control unit 301 may measure and compare the angle difference between the voltage vector and the current vector. In other words, if the derivative of the angles of the voltage vector and the current vector are the same, the angle difference between the vectors is measured directly.

Step 403

The control unit 301 checks if the angle difference which was measured or compared in step 402 is approximately 90 degrees or not. If the angle difference is approximately 90 degrees, then the method proceeds to step 404, as indicated with yes in FIG. 4. If the angle difference is not approximately 90 degrees, then the method proceeds to step 405, as indicated with no in FIG. 4.

Approximately 90 degrees may be 90 degrees±x degrees, where x is any positive integer. The x degrees may be a tolerance value. Approximately 90 degrees may be referred to as substantially 90 degrees.

Step 404

If the control unit 301 determined in step 403 that the angle difference is approximately 90 degrees, then the control unit 301 determines in step 404 that there is an indication of that the phase cables are correctly connected.

Step 405

If the control unit 301 determined in step 403 that the angle difference is not approximately 90 degrees, i.e., that is less than approximately 90 degrees or more than approximately 90 degrees, then the control unit 301 determines in step 405 that there is an indication of that the phase cables 101 are erroneously connected. If the angle difference is less than approximately 90 degrees, then it may be less than 90 degrees −x degrees. If the angle difference is more than approximately 90 degrees, then it may be more than 90 degrees +x degrees.

In step 405, the phase cables 101 are erroneously connected by being rotated as illustrated in FIG. 1c.

Step 406

When the control unit 301 have determined that there is an indication of that phase cables 101 are rotated, then the control unit 301 may determine how the phase cables 101 are rotated, e.g., CAB or BCA.

Step 407

The control unit 301 may determine to connect the phase cables 101 in the following order: CAB. The phase cables 101 may be in the order ABC before it is determined to connect them in the CAB order. The control unit 301 may provide instructions about the connection order to an output unit, e.g., a monitor or screen, where service personnel can read the instructions and perform the phase cable swap. The control unit 301 may then compare the voltage angle and the current angle once more (they were compared in step 402 for the first time). The control unit 301 checks if the angle difference is approximately 90 degrees or not. If the angle difference is approximately 90 degrees, then the method proceeds to step 409, as in indicated with yes in FIG. 4. If the angel difference is not approximately 90 degrees, then the method proceeds to step 408, as indicated with no in FIG. 4.

Step 408

If the difference between the voltage angle and the current angle is not approximately 90 degrees, then the control unit 301 determines in step 408 that the phase cables 101 are connected in the following order: BCA.

Step 409

If the difference between the voltage angle and the current angle is approximately 90 degrees, then the control unit 301 determines in step 408 that the phase cables 101 are connected in the following order: CAB.

Step 410

This step is performed after step 401 when the signs of the derivatives differ, indicated with yes in FIG. 4. When the signs of the derivatives differ, the control unit 301 determines that there is an indication of that the phase cables 101 are erroneously connected. The phase cables 101 may be erroneously connected in that two of the phase cables 101 are swapped, as illustrated in FIG. 1b.

When the signs of the derivatives differ, it implies that the vectors rotate in opposite directions. This in turn implies a negative phase sequence of the currents, which means that two of the phase cables 101 are swapped, see FIG. 1b which illustrates an example of a phase cable swap case where the phase sequence becomes BAC instead of ABC as intended.

Step 411

The control unit 301 may determine an indication of which of the three phase cables 101 that are swapped since the signs of the derivatives differ.

Step 412

The control unit 301 determines to swap the phase cable A and phase cable B. The order of the phase cables 101 at the power electronics 103 may then be BAC. The control unit 301 may provide instructions about the swap to an output unit, e.g., a monitor or screen, where service personnel can read the instructions and perform the phase cable swap.

Step 413

After the swap to BAC, the control unit 301 may measure and compare the voltage angle and the current angle. The control unit 301 checks if the angle difference is approximately 90 degrees or not. If the angle difference is approximately 90 degrees, then the method proceeds to step 414, as in indicated with yes in FIG. 4. If the angel difference is not approximately 90 degrees, then the method proceeds to step 415, as indicated with no in FIG. 4.

Step 414

This step is performed if the difference between the voltage angle and the current angle is approximately 90 degrees. The control unit 101 determines that the phase cables 101 are connected as BAC.

Step 415

This step is performed if the difference between the voltage angle and the current angle is approximately 90 degrees. The control unit 301 determines that the phase cables 101 should be swapped such that their order at the power electronics 103 is CBA. The control unit 301 may provide instructions about the swap to an output unit, e.g., a monitor or screen, where service personnel can read the instructions and perform the phase cable swap.

Step 416

After the swap to CBA, the control unit 301 may measure and compare the voltage angle and the current angle. The control unit 301 checks if the angle difference is approximately 90 degrees or not. If the angle difference is approximately 90 degrees, then the method proceeds to step 418, as in indicated with yes in FIG. 4. If the angel difference is not approximately 90 degrees, then the method proceeds to step 417, as indicated with no in FIG. 4.

Step 417

This step is performed if the difference between the voltage angle and the current angle is not approximately 90 degrees. The control unit 101 determines that the phase cables 101 are connected as ACB.

Step 418

This step is performed if the difference between the voltage angle and the current angle is approximately 90 degrees. The control unit 101 determines that the phase cables 101 are connected as CBA.

The rotor may always be locked/engaged in a gear when performing the method, and this may be a requirement for the present disclosure since it must be possible to run the method with any type of driveline configuration, e.g., when the gearbox does not comprise a clutch.

The method in FIG. 4 may be summarized as follows:

A rotating current vector in the electrical machine 105 is generated from a pulse-width modulation generated voltage vector. The frequency of the voltage vector, and therefore also of the current vector, is predetermined. Further, a current amplitude reference of the current acts as a reference value for a closed loop control of the voltage vector. Consequently, the amplitude of the voltage vector is decided by the amplitude of the current vector. The dynamics of the controller are slow to ensure a slow increase of the amplitude of the current. The slow increase of the current vector minimizes the torque fluctuations of the electrical machine 105.

The signs of the derivatives of the angles of voltage vector and the current vector are measured. The signs of the derivatives of the voltage and current angles are compared.

If the derivative of the angles of the voltage vector and the current vector are the same, the angle difference between the voltage vector and the current vector are measured directly:

If the angle difference between the voltage vector and the current vector is approximately 90 degrees, then there may be an indication of that the phase cables 101 are installed correctly.

If the angle difference between the voltage vector and the current vector is not approximately 90 degrees, the phase order of the input voltage vector is rotated, so that ABC becomes BCA, see FIG. 1c. Once again, the difference between the voltage vector and current vector are measured. If the angle difference is approximately 90 degrees, the phase cables 101 are installed as CAB, otherwise they are installed as BCA.

If the signs of the derivatives of the angles of the voltage vector and current vector differ, phase A and phase B of the input voltage vectors are swapped, whereupon the angle difference is measured.

If the angle difference between the voltage vector and the current vector is approximately 90 degrees, the phase cables 101 are installed as BAC, see FIG. 1b.

If the angle difference between the voltage vector and the current vector is not approximately 90 degrees, the phase order of the input voltage vector is rotated, so that BAC becomes CBA. Once again, the difference between the voltage vector and current vector are measured. If the angle difference is approximately 90 degrees, the phase cables 101 are installed as CBA, otherwise they are installed as ACB.

Generation of Test Signals

Before the method in FIG. 4 starts, some test signals may be generated such as a voltage vector and a current vector. As stated earlier, the method is initiated by a rotating voltage vector reference that has a predefined angular frequency and an amplitude that is generated by a closed-loop current-amplitude controller. The voltage vector is firstly transformed from polar coordinates to Cartesian coordinates. Thereafter, the vector in the Cartesian coordinates is transformed to a three-phase system with the phase sequence ABC. Typically, this type of transformation is denoted the inverse alpha-beta transformation and it is, in a symmetrical system, defined as follows:

$$\begin{bmatrix} v_a \\ v_b \\ v_c \end{bmatrix} = k \begin{bmatrix} 1 & 0 & 1 \\ -\frac{1}{2} & \frac{\sqrt{3}}{2} & 1 \\ -\frac{1}{2} & -\frac{\sqrt{3}}{2} & 1 \end{bmatrix} \begin{bmatrix} \bar{v}\sin\theta \\ \bar{v}\cos\theta \\ 0 \end{bmatrix}$$

where k is a scaling factor. The phase voltages in the three-phase reference system are realized with a pulse-width modulation scheme that supplies the power electronics 103 with duty cycles. The duty cycles control the transistors in the power electronics 103 and consequently the phase voltages of the electrical machine 105, which in turn induce currents in the machine windings of the electrical machine 105. The phase currents are measured with current sensors and transformed with alpha-beta and Cartesian-to-polar transformations to obtain the amplitude and the angle of the current vector. The current-vector amplitude is fed to the current-amplitude controller which decides a suitable amplitude for the voltage reference vector. See FIG. 5 for an illustration of the procedure.

Since the correct order of the phases is defined by the power electronics 103, the phase cable sequence, and consequently the rotational direction of the voltage vector, is always controllable and predictable. Three aspects must be considered when choosing the frequency of the voltage vector and reference amplitude of the current vector:

1) The angle of the vectors must change fast enough, and the current amplitude must be low enough, to not generate a rotation or major torque fluctuation of the rotor. The choices of appropriate rotational frequency and current amplitude need to be adjusted with consideration to the switching frequency of the converter and the characteristics of the electrical machine 103.

2) The angle must change fast enough to make sure the impedance of the machine is almost only inductive. This is to be able to estimate the angle difference, e.g., approximately 90 degrees, without knowing the values of the resistance and inductance, and to have a large enough impedance to avoid too high currents. If the resistance and inductance are known the exact angle difference can be estimated by $$\Delta\theta = \tan^{-1}\frac{\omega L}{R}$$

where Δβ is the angle difference, ω is the angular rotational frequency, L is the winding inductance and R is the winding resistance. The choices of appropriate rotational frequency and current amplitude need to be adjusted with consideration to the switching frequency of the converter and the characteristics of the electrical machine 103.

3) The dynamics of the current amplitude controller must be slow enough to not generate a fast change of the current amplitude and therefore also the torque.

Figure 5:
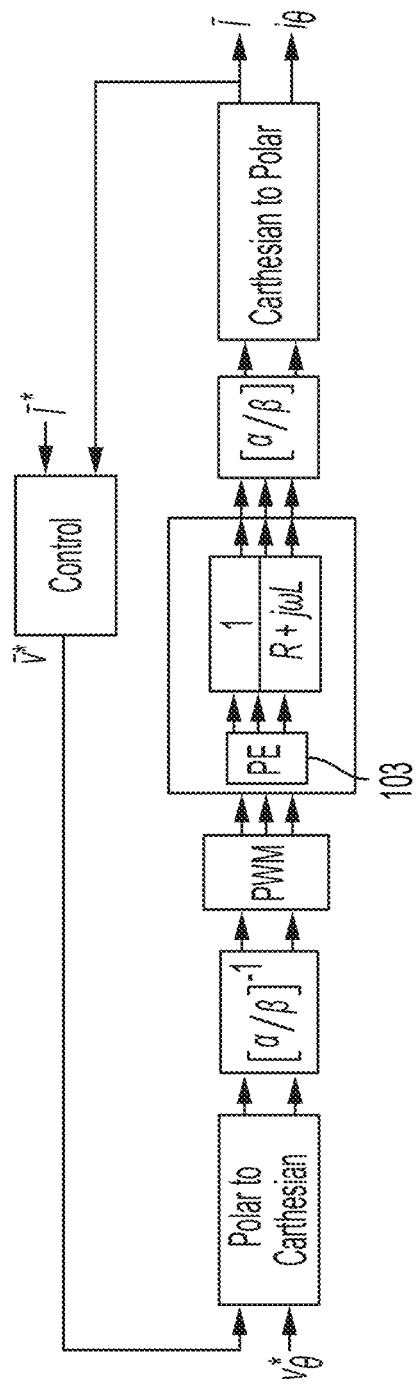
FIG. 5 is a schematic block diagram illustrating a method.

The angle and the magnitude of the current vector that results from the voltage vector are obtained by an alpha-beta and a Cartesian-to-polar transformation on the measured phase currents, see FIG. 5. The reference current amplitude should, as mentioned before, be chosen so that the torque becomes insignificant. On the other hand, the amplitude must be high enough to measure the angle of the current vector with a sufficient accuracy. If the electrical machine 103 has salient poles, the current amplitude will vary continuously when it travels over one pole pitch in the machine. This is acceptable and accounted for by the method.

Determining an Indication of Erroneous Phase Cable Installation

When the current vector has reached the specified amplitude, the angle of the current vector is obtained from the Cartesian-to-polar transformation. The sign of the derivatives of the voltage vector reference angle and the resulting current vector angle, together with the difference between the two vector angles, then indicates whether the phase cables 101 are connected correctly or not. If the electrical machine 103 is installed correctly, the current vector trails the voltage vector with a little bit less than 90 degrees. The calculated vector-angle difference should be low-pass filtered and an appropriate margin for an acceptable angle difference should be implemented. With the present invention, it is possible to track the phase cable installation without needing to impose any torque or rotation on the electrical machine 103.

Figure 6A:
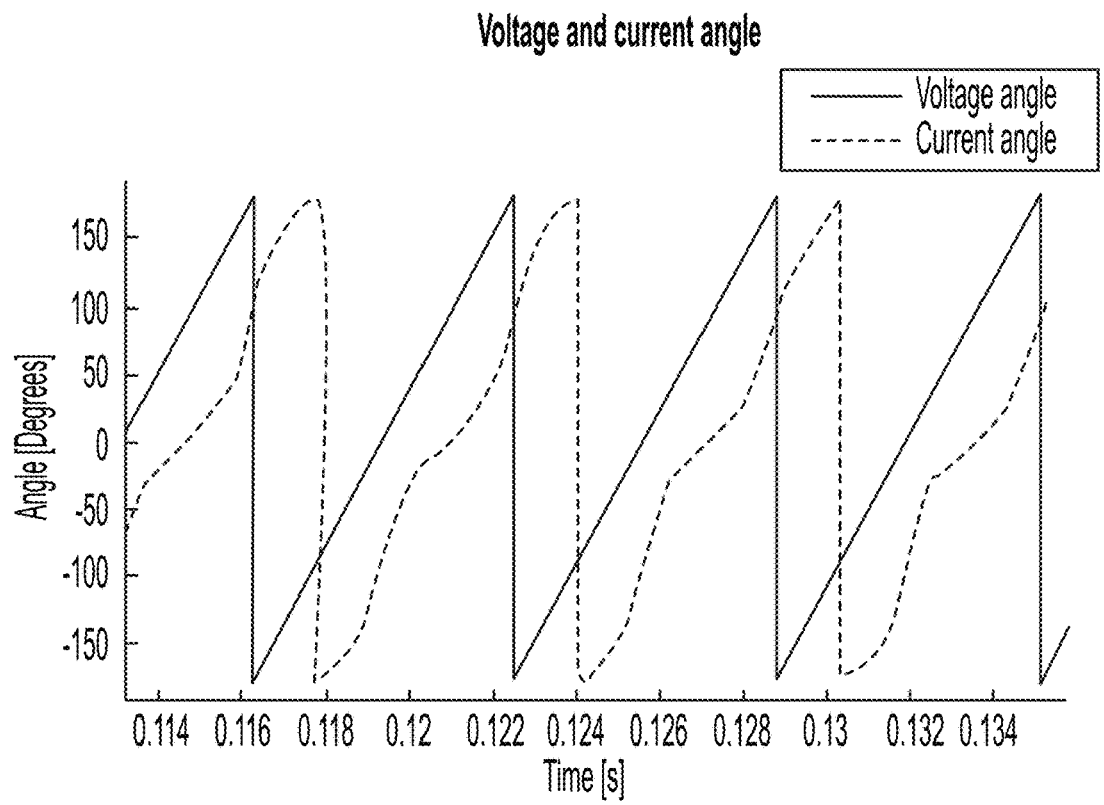
FIG. 6a is a graph illustrating voltage and current angle.

Salient poles: If the electrical machine 103 has salient poles, the angle difference between the current and voltage vector oscillates over one pole pitch. This is illustrated in FIG. 6*a* where both the voltage reference angle and the resulted current angle are shown. The x-axis of FIG. 6*a* represents time measured in seconds (s) and the y-axis represents the angle measured in degrees. The solid line illustrates the voltage angle, and the dotted line illustrates the current angle. The oscillating behavior illustrated in FIG. 6*a* occurs since the amplitude of the alpha and beta vectors are different depending on the position of the rotor. These oscillations need to be removed to analyze the average angle difference between the current and voltage vector. One solution to remove the oscillations may be to adjust the amplitudes of the alpha and beta currents in the post-processing so that they match, and then low-pass filter the current- and voltage-vector angle difference. However, any other suitable method for removing the harmonics may be applied.

Figure 6B:
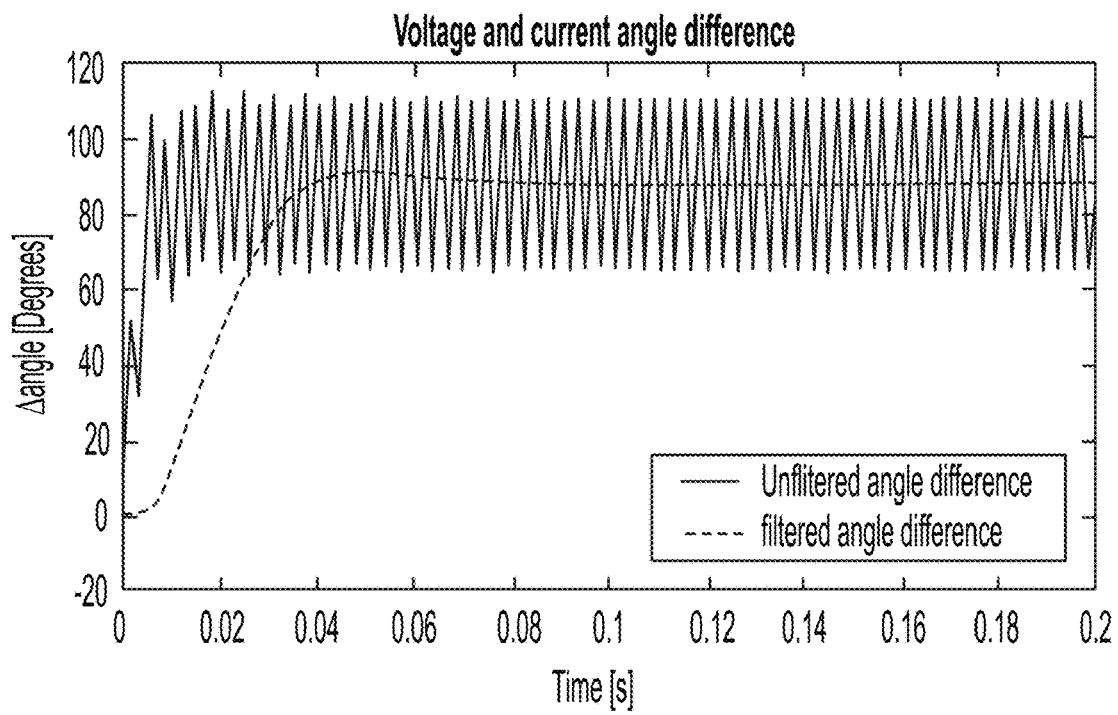
FIG. 6b is a graph illustrating voltage and current angle differences.

The difference between the voltage angle and the current angle is illustrated in FIG. 6*b*. The x-axis of FIG. 6 represents time measured in s and the y-axis represents the angle measured in degrees. The solid line represents the unfiltered angle difference, and the dotted line represents the filtered angle difference.

The step 400 and 401 of FIG. 4 described above measures and compares the signs of the derivatives of the voltage vector angle and the current vector angle. If the signs of the derivatives differ, the Case 1 below may be performed. If the derivatives have the same sign, Case 2 below may be performed.

Figure 7:
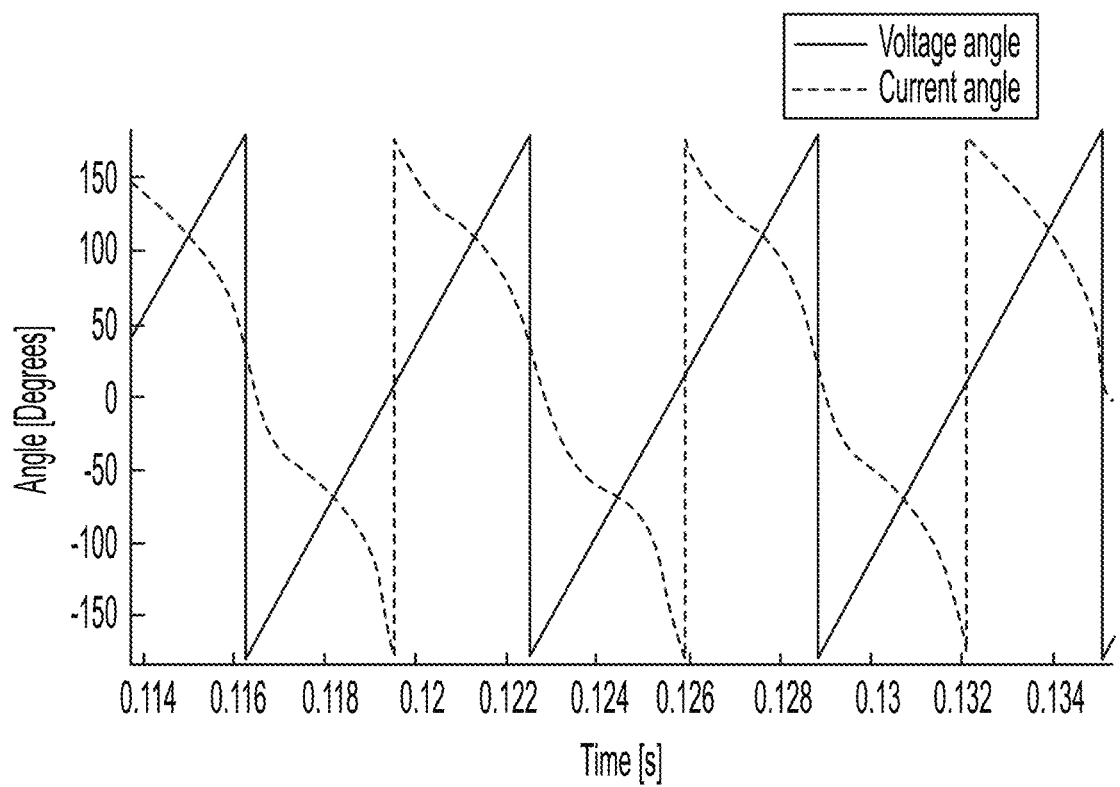
FIG. 7 is a graph illustrating voltage and current angle with switched phase cables.

Case 1: If the signs of the derivatives of the angles of the voltage vector and current vector differ, it implies that the vectors rotate in opposite directions. This in turn implies a negative phase sequence of the currents, which may be an indication of that two of the phase cables are swapped. See FIG. 1*b* for an example of a phase cable swap case where the phase sequence becomes BAC instead of ABC as intended. FIG. 7 shows the resulting voltage vector angle and current vector angle when two phases are swapped. The x-axis of FIG. 7 represents time measured in seconds and the y-axis represents angle measured in degrees. The solid line illustrates the voltage angle, and the dotted line illustrates the current angle. Case 1 may represent the right branch of the flow chart in FIG. 4, e.g., steps 410-418.

To find out which phase cables 101 that are swapped, the phase sequence of the voltage vector may be manually inversed by swapping the duty cycles of phase A with the duty cycles of phase B. This creates a voltage phase sequence of BAC, and the voltage vector now rotates in the same direction as the current vector. The difference between the voltage vector angle and the current vector angles is measured and filtered, and if the current trails the voltage with approximately 90 degrees, the phase cables 101 are connected in the sequence BAC. If the difference between the voltage- and current-vector angle is not approximately 90 degrees, the voltage phase sequence is shifted manually to CAB. If the current now trails the voltage with approximately 90 degrees, then there may be an indication of that the phase cables 101 may be connected as CAB, and if not, the phase cables 101 may be connected as BCA.

Case 2: If the signs of the derivatives of the angles of the voltage and current vectors agree, i.e., the signs do not differ, the phase sequence of the current is positive. However, the phase cable connection may still be rotated. To determine an indication of if the phase cables 101 are connected correctly, the difference between the voltage- and current-vector angles is measured. If the current trails the voltage by approximately 90 degrees, the phase cables 101 are connected correctly. If this is not the case, the phases of the voltage duty-cycle generation may be rotated to CAB instead of ABC, the duty-cycles of phase A goes to phase B and so forth. If the current now trails the voltage vector with 90 degrees, then there may be an indication of that the phase cables 101 are connected as CAB, and if not, they are connected as BCA. Case 2 may represent the left branch of the flow chart in FIG. 4, e.g., steps 402-408.

Figure 8:
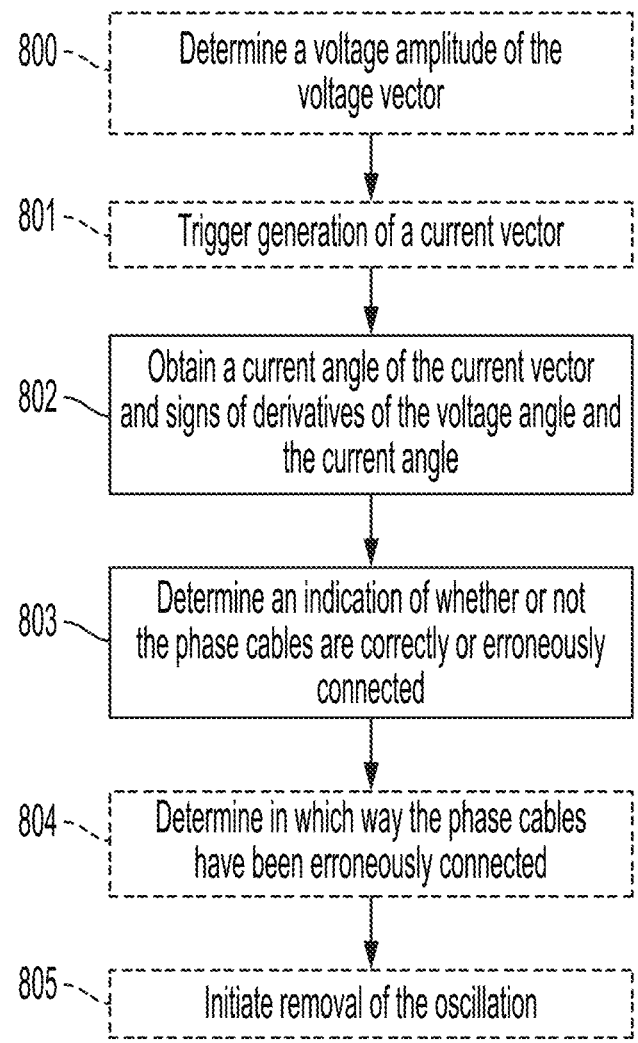
FIG. 8 is a flow chart illustrating a method.

The method described above will now be described seen from the perspective of the control unit 301. FIG. 8 is a flowchart describing the present method performed by the control unit 301 for determining an indication of whether three phase cables 101 are correctly or erroneously connected between power electronics 103 and an electrical machine 105 comprised in an at least partly electrically operated vehicle or vessel 200. The steps in dotted boxes may be optional steps. The method comprises at least one of the following steps to be performed by the control unit 301, which steps may be performed in any suitable order than described below:

Step 800

The control unit 301 may determine, by means of a closed loop control, a voltage amplitude of the voltage vector using the current amplitude reference as a reference value. The current amplitude reference may be predetermined.

Step 801

The control unit 301 triggers generation of a current vector in the electrical machine 105 from the voltage vector. The voltage vector has a voltage angle. The voltage vector may have the voltage amplitude determined in step 800. The control unit 301 may trigger the generation of the current vector by sending instructions to the power electronics 103 which generates a voltage and which in turn induces current in the windings of the electrical machine 105.

Step 802

When the current vector has a reached a current amplitude reference, the control unit 301 obtains a current angle of the current vector and signs of derivatives of the voltage angle and the current angle. The control unit 301 comprises information about the current amplitude reference. The current amplitude reference may be predetermined or predefined.

The information about the current amplitude reference may have been obtained by the control unit 301 at any suitable time before step 802 is performed, e.g., obtained from a memory storage, locally within the control unit 301, a cloud memory, a central memory storage in the vehicle 200 or from any other suitable memory storage. The information about the current amplitude reference may be obtained by the control unit 301 upon request, at regular time intervals, at a random time instance, it may be pushed to the control unit 301 or obtained in any other suitable way.

The current angle may be obtained by being measured by the control unit 301.

The signs of the derivatives may be + or −.

Step 803

This step may correspond to one or more of steps 400, 401, 403, 404, 405 and 410 in FIG. 4. Based on the signs of derivatives, the control unit 301 determines an indication of whether or not the phase cables 205 are correctly or erroneously connected.

The control unit 301 may compare the signs of derivatives of the voltage angle and the current angle.

The control unit 301 may determine that there is an indication of that the phase cables 101 are erroneously connected if the signs of derivatives differ.

The determining of an indication of whether or not the phase cables 101 are correctly or erroneously connected may be further based on the current angle and the voltage angle.

The control unit 301 may determine, for a first time, a difference between the voltage angle and the current angle if the signs of derivatives are the same. The control unit 301 may determine that there is an indication of that the phase cables 101 are correctly connected if the difference is approximately 90 degrees. The control unit 301 may determine that there is indication of that the phase cables 101 are erroneously connected if is not approximately 90 degrees.

As mentioned earlier, approximately 90 degrees may be 90 degrees ±x degrees, where x is any positive integer. The x degrees may be a tolerance value. Approximately 90 degrees may be referred to as substantially 90 degrees.

Step 804

This step may correspond to one or more of steps 406, 407, 408, 409, 411, 413, 414, 416, 417 and 418 in FIG. 4. When it has been determined that there is an indication of that the phase cables 101 are erroneously connected, the control unit 301 may determine in which way the phase cables 101 have been erroneously connected.

The control unit 301 may determine, for a first time or a second time, a difference between the voltage angle and the current angle. The phase cables 101 may be erroneously connected in a first way if the difference is approximately 90 degrees. The phase cables 101 may be erroneously connected in a second way if the difference is not approximately 90 degrees.

Two phase cables 101 may be swapped when the signs of derivatives of the voltage angle and the current angle differ.

Step 805

If the difference between the voltage angle and the current angle oscillates over one pole pitch, the control unit 301 may trigger removal of the oscillation. The oscillation may be removed in postprocessing of the measured data.

Figure 9:
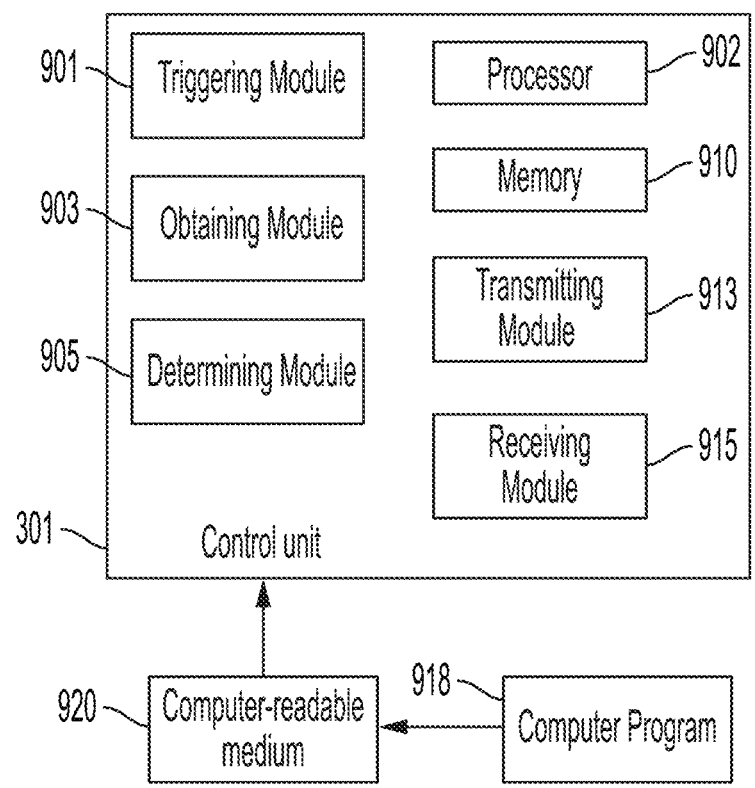
FIG. 9 is a schematic block diagram illustrating a control unit.

To perform the method steps shown in FIGS. 4 and 8 for determining an indication of whether three phase cables 101 are correctly or erroneously connected between power electronics 103 and an electrical machine 105 comprised in an at least partly electrically operated vehicle or vessel 200, the control unit 301 may comprise an arrangement as shown in FIG. 9.

The control unit 301 is adapted to perform the steps described herein.

The control unit 301 is adapted to, e.g., by means of a triggering module 901, trigger generation of a current vector in the electrical machine 105 from a voltage vector. The voltage vector has a voltage angle. The triggering module 901 may also be referred to as a triggering unit, a triggering means, a triggering circuit, means for triggering etc. The triggering module 901 may be a processor 902 of the control unit 301 or comprised in the processor 902 of the control unit 301.

The control unit 301 is adapted to, e.g., by means of an obtaining module 903, when the current vector has a reached a current amplitude reference, obtain a current angle of the current vector and signs of derivatives of the voltage angle and the current angle. The current amplitude reference may be predetermined. The obtaining module 903 may also be referred to as an obtaining unit, an obtaining means, an obtaining circuit, means for obtaining etc. The obtaining module 903 may be the processor 902 of the control unit 301 or comprised in the processor 902 of the control unit 301.

The control unit 301 is adapted to, e.g., by means of a determining module 905, based on the signs of derivatives, determine an indication of whether or not the phase cables 101 are correctly or erroneously connected. The determining module 905 may also be referred to as a determining unit, a determining means, a determining circuit, means for determining etc. The determining module 905 may be the processor 902 of the control unit 301 or comprised in the processor 902 of the control unit 301.

The control unit 301 may be adapted to, e.g., by means of the determining module 905, compare the signs of derivatives of the voltage angle and the current angle.

The control unit 301 may be adapted to, e.g., by means of the determining module 905, determine that there is an indication of that the phase cables 101 are erroneously connected if the signs of derivatives differ.

The control unit 301 may be adapted to, e.g., by means of the determining module 905, determine an indication of whether or not the phase cables 101 are correctly or erroneously connected further based on the current angle and the voltage angle.

The control unit 301 may be adapted to, e.g., by means of the determining module 905, determine, for a first time, a difference between the voltage angle and the current angle if the signs of derivatives are the same.

The control unit 301 may be adapted to, e.g., by means of the determining module 905, determine that there is an indication of that the phase cables 101 are correctly connected if the difference is approximately 90 degrees.

The control unit 301 may be adapted to, e.g., by means of the determining module 905, determine that there is an indication of that the phase cables 101 are erroneously connected if is not approximately 90 degrees.

The control unit 301 may be adapted to, e.g., by means of the determining module 905, when an indication of that the phase cables 101 are erroneously connected has been determined, determine in which way the phase cables 101 have been erroneously connected.

The control unit 301 may be adapted to, e.g., by means of the determining module 905, determine, for a first time or a second time, a difference between the voltage angle and the current angle. The phase cables 101 may be erroneously connected in a first way if the difference is approximately 90 degrees. The phase cables 101 may be erroneously connected in a second way if the difference is not approximately 90 degrees.

Two phase cables 101 may be swapped when the signs of derivatives of the voltage angle and the current angle differ.

The control unit 301 may be adapted to, e.g., by means of the determining module 905, determine, by means of a closed loop control, a voltage amplitude of the voltage vector using the current amplitude reference as a reference value. The current amplitude reference may be predetermined.

The control unit 301 may be adapted to, e.g., by means of the triggering module 901, if the difference between the voltage angle and the current angle oscillates over one pole pitch, trigger removal of the oscillation.

The control unit 301 may comprise a memory 910 comprising one or more memory units. The memory 910 is arranged to be used to store obtained information, measurements of voltage vectors and current vectors, voltage angle, current angle, current amplitude reference, voltage amplitude, signs of derivatives, information indicating whether or not the phase cables 101 are correctly or erroneously connected, information indicating in which way the phase cables 101 have been erroneously connected, oscillation information, applications etc. to perform the methods herein when being executed in the control unit 301.

The control unit 301 may comprise a transmitting module 913. The transmitting module 913 may be adapted to transmit information, triggers, instructions, measurements etc. to other modules and units comprised in the vehicle 200. The transmitting module 913 may also be referred to as a transmitting unit, a transmitting means, a transmitting circuit, means for transmitting, output unit, etc. The transmitting module 913 may be a transmitter, a transceiver etc. The transmitting module 913 may be a wireless transmitter or a wired transmitter.

The control unit 301 may comprise a receiving module 915. The receiving module 915 may be adapted to receiving information, triggers, instructions, measurements etc. from other modules and units comprised in the vehicle 200. The receiving module 915 may also be referred to as a receiving unit, a receiving means, a receiving circuit, means for receiving, input unit, etc. The receiving module 915 may be a receiver, a transceiver etc. The receiving module 915 may be a wireless receiver or a wired receiver.

The present invention related to the control unit 301 may be implemented through one or more processors, such as the processor 902 comprised in the control unit 301 depicted in FIG. 9, together with computer program code for performing the functions and actions described herein. A processor, as used herein, may be understood to be a hardware component. The program code mentioned above may also be provided as a computer program product, for instance in the form of a data carrier carrying computer program code for performing the present disclosure when being loaded into the control unit 301. One such carrier may be in the form of a CD ROM disc. It is however feasible with other data carriers such as a memory stick. The computer program code may be provided as pure program code on a server and downloaded to the control unit 301.

Those skilled in the art will also appreciate that the triggering module 901, the obtaining module 903, the determining module 905 and other module(s) described above may refer to a combination of analogue and digital circuits, and/or one or more processors configured with software and/or firmware, e.g., stored in memory, that, when executed by the one or more processors such as the processor 902, perform as described above. One or more of these processors, as well as the other digital hardware, may be comprised in a single Application-Specific Integrated Circuit (ASIC), or several processors and various digital hardware may be distributed among several separate components, whether individually packaged or assembled into a System-on-a-Chip (SoC).

Thus, the methods described herein for the UE 105 may be respectively implemented by means of a computer program 918, comprising instructions, i.e., software code portions, which, when executed on at least one processor 902, cause the at least one processor 902 to carry out the actions described herein, as performed by the control unit 301. The computer program 918 may be a computer program product. The computer program 918 may be stored on a computer-readable medium 920. The computer-readable medium 920 may be a computer-readable storage medium. The computer-readable medium 920, having stored thereon the computer program 918, may comprise instructions which, when executed on at least one processor 902, cause the at least one processor 902 to carry out the method described herein, as performed by the control unit 301. The computer-readable medium 920 may be a non-transitory computer-readable storage medium, such as a CD ROM disc, or a memory stick. The computer program 918 may be stored on a carrier comprising the computer program 918 just described. The carrier may be one of an electronic signal, optical signal, radio signal, or the computer-readable medium 920, as described above.

The least partly electrically operated vehicle or vessel 200 comprises the control unit 301 described herein.

This present invention enables to verify if the mechanical mounting of the phase cables 101 of the electrical machine 103 controlled by the power electronics 103, e.g., three-phase converters, are correct. The method may be performed by the control system, e.g., the control unit 301 of or associated with the power electronics 103 that controls the electrical machine 103.

The present invention relates to a phase cable mounting sanity check of an electric machine 103 controlled by power electronics 103.

It is to be understood that the present invention is not limited to the embodiments described above and illustrated in the drawings; rather, the skilled person will recognize that many changes and modifications may be made within the scope of the appended claims.

In general, the usage of "first", "second", "third", "fourth", and/or "fifth" herein may be understood to be an arbitrary way to denote different elements or entities, and may be understood to not confer a cumulative or chronological character to the nouns they modify, unless otherwise noted, based on context.

The term "at least one of A and B" should be understood to mean "only A, only B, or both A and B.", where A and B are any parameter, number, indication used herein etc.

It should be emphasized that the term "comprises/comprising" when used in this specification is taken to specify the presence of stated features, integers, steps or components, but does not preclude the presence or addition of one or more other features, integers, steps, components or groups thereof. It should also be noted that the words "a" or "an" preceding an element do not exclude the presence of a plurality of such elements.

The term "configured to" used herein may also be referred to as "arranged to", "adapted to", "capable of" or "operative to".

The steps of the methods may be performed in another order than the order in which they appear herein.

The invention claimed is:

1. An at least partly electrically operated vehicle or vessel, comprising:
    power electronics;
    an electrical machine;
    three phase cables connected between the power electronics and the electrical machine; and
    a control unit configured to:
        determine, by means of a closed loop control, a voltage amplitude of a voltage vector using a current amplitude reference as a reference value;
        trigger generation of a current vector, based on an induced current in a winding of the electrical machine through a voltage generated by the power electronics, wherein the current vector is generated from the voltage vector having the voltage amplitude, wherein the current vector and the voltage vector are both rotating vectors that rotates with the same angular frequency, and wherein the voltage vector has a voltage angle;
        when the current vector has a reached the current amplitude reference, measuring a current angle of the current vector and signs of derivatives of the voltage angle and the current angle, wherein the signs of the derivatives are plus or minus; and
        compare the signs of derivatives of the voltage angle and the current angle,
        determine when the sign of the of derivative of the voltage angle and the sign of derivative of the current angle are different, indicate that the three phase cables are erroneously;
        determine a difference between the current angle and voltage angle when the sign of the of derivative of the voltage angle and the sign of derivative of the current angle are the same; and
        wherein determine an indication of whether or not the three phase cables are correctly or erroneously connected is further based on the current angle and the voltage angle, include compare the difference between the current angle and the voltage angle to an approximately 90 degree angle to indicates whether the three phase cables are correctly or erroneously connected.

2. The at least partly electrically operated vehicle or vessel according to claim 1, wherein the determine the indication of whether or not the phase cables are correctly or erroneously connected comprises:
    determine that there is an indication of that the phase cables are erroneously connected if the signs of derivatives differ.

3. The at least partly electrically operated vehicle or vessel according to claim 1, wherein the determine the indication of whether or not the phase cables are correctly or erroneously connected comprises:
    determine, for a first time, a difference between the voltage angle and the current angle if the signs of derivatives are the same;
    determine that there is an indication of that the phase cables are correctly connected if the difference is approximately 90 degrees; and
    determine that there is an indication of that the phase cables are erroneously connected if is not approximately 90 degrees.

4. The at least partly electrically operated vehicle or vessel according to claim 1, comprising:
    when the indication of that the phase cables are erroneously connected has been determined, determine in which way the phase cables have been erroneously connected.

5. The at least partly electrically operated vehicle or vessel according to claim 4, wherein the determine in which way the phase cables have been erroneously connected comprises:
    wherein the phase cables are erroneously connected in a first way if the difference is approximately 90 degrees, and wherein the phase cables are erroneously connected in a second way if the difference is not approximately 90 degrees.

6. The at least partly electrically operated vehicle or vessel according to claim 1, wherein two phase cables are swapped when the signs of derivatives of the voltage angle and the current angle differ.

7. The at least partly electrically operated vehicle or vessel according to claim 1, comprising:
    if the difference between the voltage angle and the current angle oscillate over one pole pitch, triggering removal of an oscillation.

8. A control unit for determining an indication of whether three phase cables are correctly or erroneously connected between power electronics and an electrical machine comprised in an at least partly electrically operated vehicle or vessel, comprising the control unit being adapted to:
    determine, by means of a closed loop control, a voltage amplitude of a voltage vector using a current amplitude reference as a reference value;
    trigger generation of a current vector, based on an induced current in a winding of the electrical machine through a voltage generated by the power electronics, wherein the current vector is generated from the voltage vector having the voltage amplitude, wherein the current vector and the voltage vector are both rotating vectors that rotates with the same angular frequency, and wherein the voltage vector has a voltage angle;
    when the current vector has a reached the current amplitude reference, measuring a current angle of the current vector and signs of derivatives of the voltage angle and the current angle, wherein the signs of the derivatives are plus or minus; and
    compare the signs of derivatives of the voltage angle and the current angle,
    determine when the sign of the of derivative of the voltage angle and the sign of derivative of the current angle are different, indicate that the three phase cables are erroneously;

determine a difference between the current angle and voltage angle when the sign of the of derivative of the voltage angle and the sign of derivative of the current angle are the same; and wherein determine an indication of whether or not the three phase cables are correctly or erroneously connected is further based on the current angle and the voltage angle, include compare the difference between the current angle and the voltage angle to an approximately 90 degree angle to indicates whether the three phase cables are correctly or erroneously connected.

9. A non-transitory computer readable medium carrying a computer program comprising program codes, when the computer program codes are run on a computer comprising:

determine, by means of a closed loop control, a voltage amplitude of a voltage vector using a current amplitude reference as a reference value;

trigger generation of a current vector, based on an induced current in a winding of an electrical machine through a voltage generated by power electronics, wherein three phase cables connected between the power electronics and the electrical machine, wherein the current vector is generated from the voltage vector having the voltage amplitude, wherein the current vector and the voltage vector are both rotating vectors that rotates with the same angular frequency, and wherein the voltage vector has a voltage angle;

when the current vector has a reached the current amplitude reference, measuring a current angle of the current vector and signs of derivatives of the voltage angle and the current angle, wherein the signs of the derivatives are plus or minus; and compare the signs of derivatives of the voltage angle and the current angle, determine when the sign of the of derivative of the voltage angle and the sign of derivative of the current angle are different, indicate that the three phase cables are erroneously;

determine a difference between the current angle and voltage angle when the sign of the of derivative of the voltage angle and the sign of derivative of the current angle are the same; and wherein determine an indication of whether or not the three phase cables are correctly or erroneously connected is further based on the current angle and the voltage angle, include compare the difference between the current angle and the voltage angle to an approximately 90 degree angle to indicates whether the three phase cables are correctly or erroneously connected.

* * * * *